(12) United States Patent
Tabat

(10) Patent No.: US 8,455,060 B2
(45) Date of Patent: Jun. 4, 2013

(54) METHOD FOR DEPOSITING HYDROGENATED DIAMOND-LIKE CARBON FILMS USING A GAS CLUSTER ION BEAM

(75) Inventor: Martin D. Tabat, Nashua, NH (US)

(73) Assignee: TEL Epion Inc., Billerica, MA (US)

( * ) Notice: Subject to any disclaimer, the term of this patent is extended or adjusted under 35 U.S.C. 154(b) by 941 days.

(21) Appl. No.: 12/389,010

(22) Filed: Feb. 19, 2009

(65) Prior Publication Data

US 2010/0209627 A1  Aug. 19, 2010

(51) Int. Cl.
*C23C 14/28* (2006.01)
*H05B 6/00* (2006.01)
*C23C 16/00* (2006.01)

(52) U.S. Cl.
USPC ............... 427/595; 427/248.1; 427/249.1

(58) Field of Classification Search
USPC .................. 427/248.1, 249.1, 595
See application file for complete search history.

(56) References Cited

U.S. PATENT DOCUMENTS

| | | | |
|---|---|---|---|
| 4,361,762 A | 11/1982 | Douglas | |
| 4,886,971 A | 12/1989 | Matsumura et al. | |
| 4,916,311 A | 4/1990 | Fuzishita et al. | |
| 5,705,272 A * | 1/1998 | Taniguchi | 428/408 |
| 7,060,989 B2 | 6/2006 | Swenson et al. | |
| 2002/0063830 A1 * | 5/2002 | Callegari et al. | 349/124 |
| 2002/0130275 A1 | 9/2002 | Mack et al. | |
| 2005/0271831 A1 * | 12/2005 | Takakuwa | 427/595 |

FOREIGN PATENT DOCUMENTS

JP  62296357 A  12/1987

OTHER PUBLICATIONS

Kitagawa et al. Near Edge Xray Absorptions Fine Structure Study for Optimization of Hard Diamond-Like Carbon Film Formation with Ar Cluster Ion Beam, Jpn. J. Appl. Phys. vol. 42 (Jun. 2003) pp. 3971-3975.*
Haruyama et al. X-ray Photoelectron Spectroscopy Study of Diamond Like Carbon Thin Films Formed by Ar Gas Cluster Ion Beam Assisted Fullerene Deposition, Jpn. J. Appl. Phys. vol. 45 No. 5 (2008) pp. 3380-3383.*
Isao Yamada et al., "Materials Processing by Gas Cluster Ion Beams", Materials Science and Engineering Reports, vol. 34, Issue 6, pp. 231-295, Oct. 30, 2001 (ISSN 09S7-796X).
Saitoh, Y. et al., Acceleration of cluster and molecular ions by TIARA 3 MV tandem accelerator, vol. 452, No. 1-2, Sep. 21, 2000, pp. 61-66, XP004210610, ISSN: 0168-9002.
Yamada, I. et al., Surface modification with gas cluster ion beams, Nuclear Instruments & Methods in Physics Research, vol. B79, Nov. 2, 1992, pp. 223-226, XP001031961, ISSN: 0168-583X.

* cited by examiner

*Primary Examiner* — Kelly M Gambetta
(74) *Attorney, Agent, or Firm* — Wood, Herron & Evans, LLP

(57) ABSTRACT

A method for depositing a hydrogenated diamond-like carbon (H-DLC) film on a surface of a substrate. The method includes maintaining a reduced-pressure environment around a substrate holder for holding a substrate, holding the substrate securely within the reduced-pressure environment, and forming a gas cluster ion beam (GCIB) from a pressurized gas containing hydrocarbon gas and a carrier gas. The method further includes accelerating the GCIB to the reduced-pressure environment, irradiating the accelerated GCIB onto at least a portion of the surface of the substrate, and forming an H-DLC film on the surface.

20 Claims, 5 Drawing Sheets

METHOD FOR DEPOSITING HYDROGENATED DIAMOND-LIKE CARBON FILMS USING A GAS CLUSTER ION BEAM

FIELD OF INVENTION

The invention relates to a method for processing a substrate using a gas cluster ion beam (GCIB), and more particularly to a method for depositing hydrogenated diamond-like carbon (H-DLC) films on a substrate using a GCIB.

BACKGROUND OF THE INVENTION

Gas cluster ion beams (GCIBs) are used for etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion.

The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Conventional cluster ion sources produce cluster ions having a wide size distribution scaling with the number of molecules in each cluster that may reach several thousand molecules. Clusters of atoms can be formed by the condensation of individual gas atoms (or molecules) during the adiabatic expansion of high pressure gas from a nozzle into a vacuum. A skimmer with a small aperture strips divergent streams from the core of this expanding gas flow to produce a collimated beam of clusters. Neutral clusters of various sizes are produced and held together by weak inter-atomic forces known as Van der Waals forces. This method has been used to produce beams of clusters from a variety of gases, such as helium (He), neon (Ne), argon (Ar), krypton (Kr), xenon (Xe), nitrogen ($N_2$), oxygen ($O_2$), carbon dioxide ($CO_2$), sulfur hexafluoride ($SF_6$), nitric oxide (NO), nitrous oxide ($N_2O$), and mixtures of these gases.

Several emerging applications for GCIB processing of substrates on an industrial scale are in the semiconductor field. Although GCIB processing of a substrate is performed using a wide variety of gas-cluster source gases, many of which are inert gases, many semiconductor processing applications use reactive source gases, sometimes in combination or mixture with inert or noble gases, to form the GCIB.

SUMMARY OF THE INVENTION

The invention relates to a method for depositing hydrogenated diamond-like carbon (H-DLC) films using a hydrocarbon gas and a carrier gas in a gas cluster ion beam (GCIB). According to embodiments of the invention, the hydrocarbon gas can have a general formula $C_xH_y$, where x has a range of between 1 and 4 and y has a range of between 2 and 10. According to one embodiment of the invention, the hydrocarbon gas is methane ($CH_4$) gas. According to another embodiment of the invention, the hydrocarbon gas is ethane ($C_2H_6$) gas. According to one embodiment, the carrier gas can contain He gas, hydrogen ($H_2$) gas, ammonia ($NH_3$) gas, or a combination thereof. According to one embodiment, the GCIB is accelerated by an acceleration voltage greater than 30 keV.

According to one embodiment of the invention, the method includes maintaining a reduced-pressure environment around a substrate holder for holding a substrate having a surface, holding the substrate securely within the reduced-pressure environment, and forming a gas cluster ion beam (GCIB) from a pressurized gas comprising hydrocarbon gas and a carrier gas. The method further includes accelerating the GCIB to the reduced-pressure environment, irradiating the accelerated GCIB onto at least a portion of the surface, and forming an H-DLC film on the surface. According to one embodiment of the invention, the H-DLC film contains a diamond carbon phase having $sp^3$ bonds and a carbon phase having non-$sp^3$ bonds, where the percentage of the $sp^3$ bonds in the H-DLC film is greater than approximately 60 atomic %, and the H-DLC film has a hydrogen content less than approximately 30 atomic %.

DETAILED DESCRIPTION OF SEVERAL EMBODIMENTS

Figure 1:
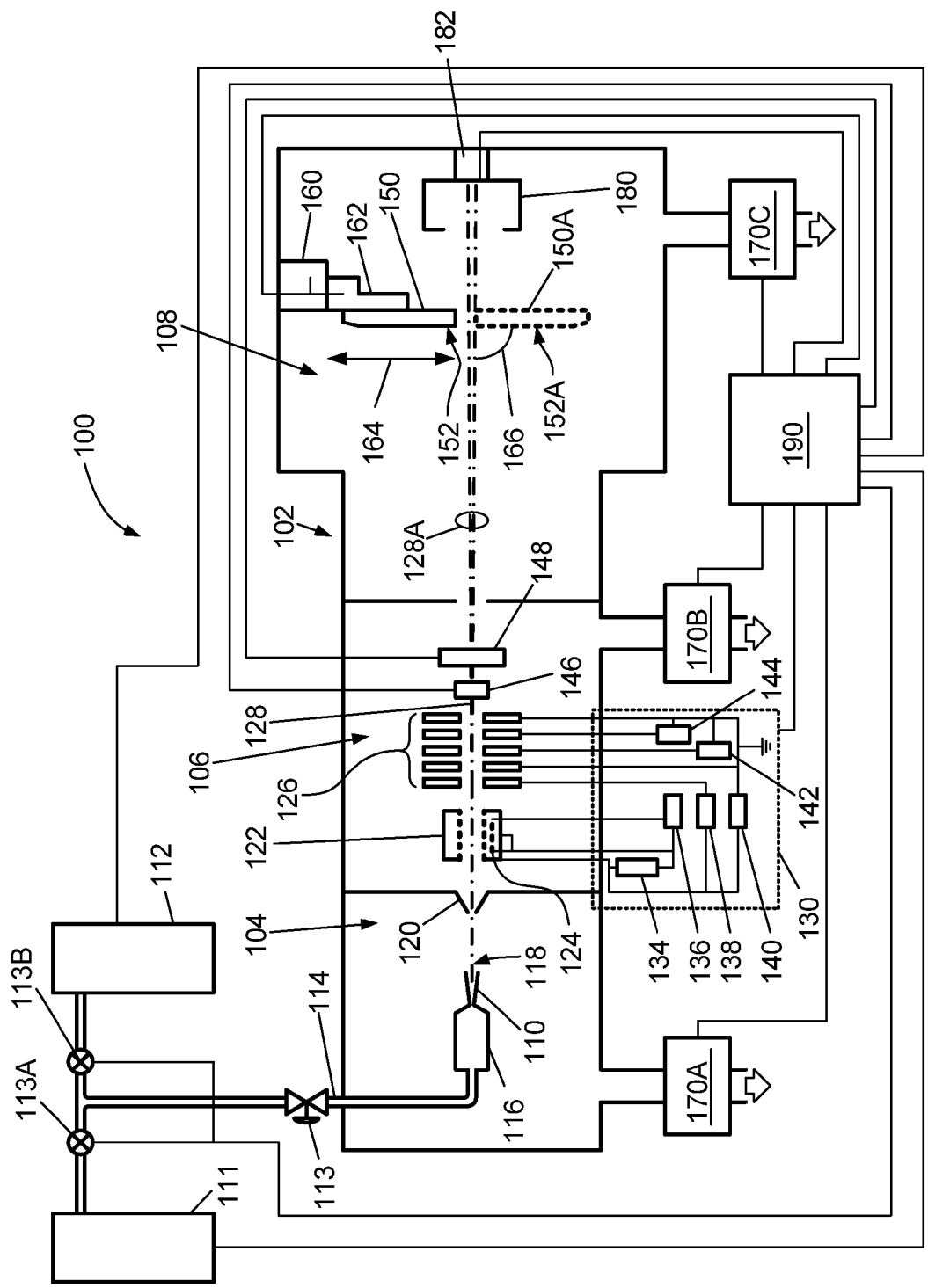
FIG. 1 is an illustration of a GCIB processing system.

A method and system for depositing H-DLC films on a substrate using a gas cluster ion beam (GCIB) are disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but does not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One application for GCIB processing of substrates on an industrial scale includes deposition of diamond-like carbon (DLC) films. For example, DLC films are commonly used for hard carbon coatings, which have similar mechanical, optical, and electrical properties as natural diamond, without having dominant crystalline lattice structure. One example of the use of DLC films includes formation of a critical protective layer on magnetic hard disks and their reading heads. DLC films are amorphous and contain a mixture of an $sp^3$ bonded diamond carbon matrix and $sp^2$ bonded graphite clusters embedded in the amorphous $sp^3$ bonded diamond carbon matrix.

Hydrogenated diamond-like carbon (H-DLC) films can have similar properties as DLC films but, in addition to carbon, contain various quantities of hydrogen. In some examples, DLC coatings may have about 85-95% $sp^3$ bonds in the carbon structure and hydrogen content less than about 1 atomic %. For comparison, some H-DLC films may have greater than 30% $sp^3$ bonds and hydrogen content greater than 10 atomic %.

There is a need for new methods for depositing H-DLC films from hydrocarbon source gases on large substrates in order to enable industrial scale manufacturing of semiconductor devices containing such films. The large substrates can include 200 mm, 300 mm, or even larger Si wafers. The inventors have discovered that GCIB processing may be utilized to deposit H-DLC films using a hydrocarbon source gas in combination with a carrier gas. According to one embodiment, GCIB processing may be utilized to deposit H-DLC films using a hydrocarbon source gas in combination with a low molecular weight carrier gas, such as He gas, $H_2$ gas, and/or $NH_3$ gas at a high GCIB acceleration energy of greater than about 30 keV.

According to one embodiment of the invention, a method for depositing a thin H-DLC film on a surface of a substrate is described. The method includes maintaining a reduced-pressure environment around a substrate holder for holding a substrate having a surface, and holding the substrate securely within the reduced-pressure environment. The method further includes forming a GCIB from a pressurized gas containing hydrocarbon gas and a carrier gas, and accelerating the GCIB to the reduced-pressure environment. The method further includes irradiating the accelerated GCIB onto at least a portion of the surface of the substrate; and forming an H-DLC film on the surface by decomposition of the hydrocarbon gas on the surface.

According to an embodiment of the invention, a GCIB processing system 100 is depicted in FIG. 1 comprising a vacuum vessel (process chamber) 102, substrate holder 150, upon which a substrate 152 to be processed is affixed and around which a reduced-pressure environment is maintained during substrate processing, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 1, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a gas cluster ion beam can be formed in the second chamber (ionization/acceleration chamber 106) wherein the gas cluster beam is ionized and accelerated. Then, in the third chamber (processing chamber 108), the accelerated gas cluster ion beam may be utilized to treat substrate 152.

As shown in FIG. 1, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Furthermore, for example, the first gas composition or the second gas composition or both can comprise a film forming gas composition. Further yet, for example, the first gas composition or second gas composition or both can include a condensable inert gas, carrier gas or dilution gas. For example, the inert gas, carrier gas or dilution gas can include a noble gas, i.e., He, Ne, Ar, Kr, or Xe. According to one embodiment of the invention, the first gas composition can include a hydrocarbon gas and the second gas composition can include He gas. According to one embodiment, the second gas composition can include a carrier gas containing He gas, hydrogen ($H_2$) gas, or ammonia ($NH_3$) gas, or a combination thereof. According to one embodiment, the pressurized gas can further contain Ar gas, $N_2$ gas, or $O_2$ gas, or a combination thereof.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 1, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 70 keV.

As illustrated in FIG. 1, the beam electronics 130 further include an anode power supply 134 that provides voltage $V_A$ to an anode of ionizer 122 for accelerating electrons emitted from filament 124 and causing the electrons to bombard the gas clusters in gas cluster beam 118, which produces cluster ions.

Additionally, as illustrated in FIG. 1, the beam electronics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{acc}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 1, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

Although not shown in FIG. 1, a pressure cell may be disposed in the path of GCIB 128, for example downstream from the high voltage electrodes 126 and the beam gate 148. The pressure cell may be pressurized with an inert gas to a higher gas pressure than in the ionization/acceleration chamber 106 and in the processing chamber 108. GCIB processing conditions when using a pressure cell may be expressed as an integral of the distance traveled by the GCIB 128 through the pressure cell at the higher gas pressure (e.g., in units of Torr-cm). As the GCIB 128 passes through the pressure cell, characteristics of the GCIB 128 are modified in a way that improves its suitability for certain processing applications. For example, the modified characteristics of the GCIB 128 can include a modified distribution of gas cluster ion frequency when plotted versus gas cluster ion energy per charge. Examples of a pressure cell used in a GCIB processing system are described in U.S. Pat. No. 7,060,989, entitled Method and Apparatus for Improved Processing with a Gas-Cluster Ion Beam.

The process GCIB 128A is accelerated from the ionization/acceleration chamber 106 into the reduced-pressure environment around the substrate holder 150 in processing chamber 108. A substrate 152, which may be a wafer or semiconductor wafer, a flat panel display (FPD), a liquid crystal display (LCD), or other substrate to be processed by GCIB processing, is held securely within the reduced-pressure environment and is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 1, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a Faraday cup or the like, closed except for a beam-entry opening, and is typically affixed to the wall of the vacuum vessel 102 with an electrically insulating mount 182.

As shown in FIG. 1, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 2:
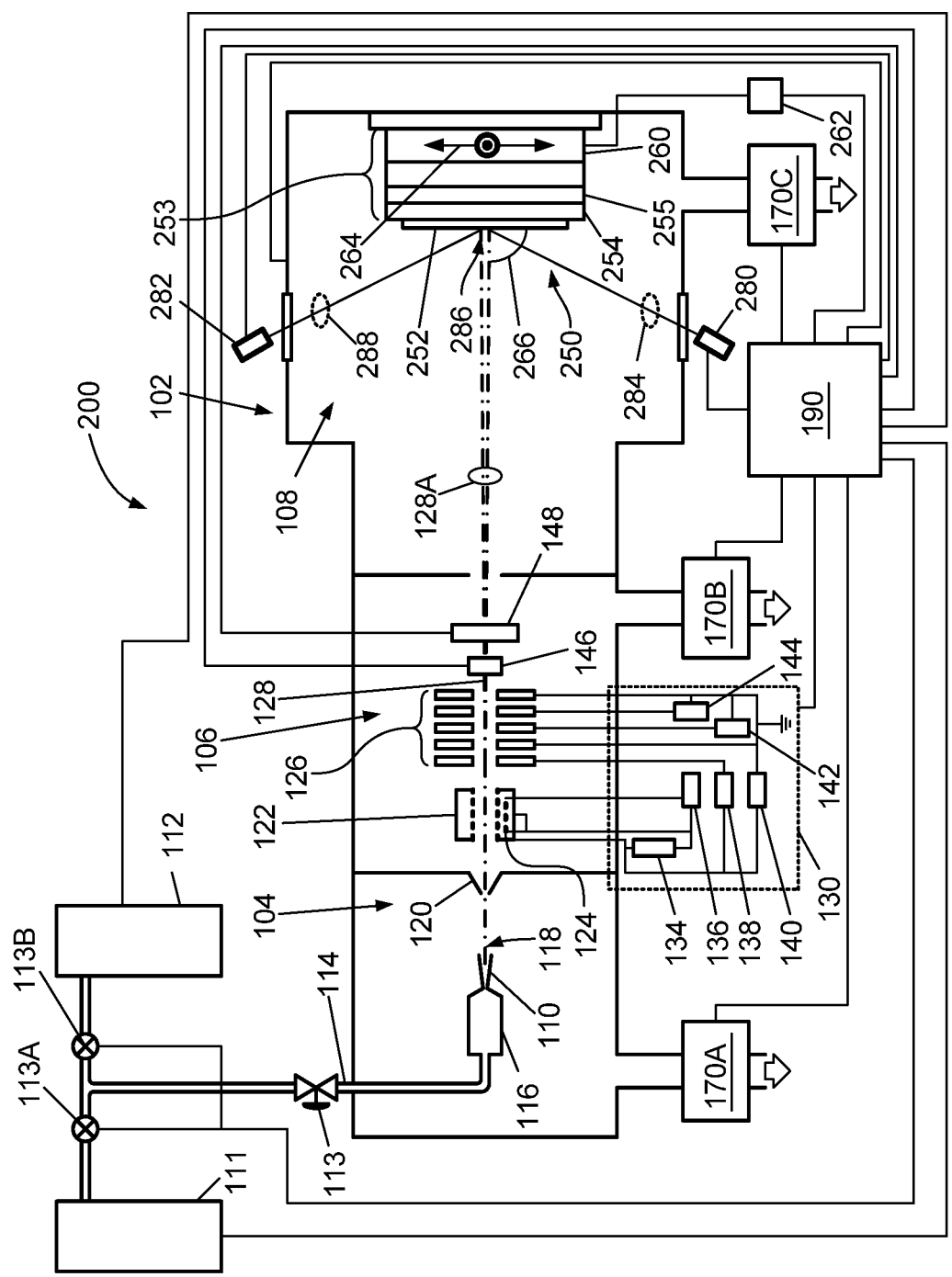
FIG. 2 is another illustration of a GCIB processing system.

In the embodiment shown in FIG. 2, the GCIB processing system 200 can be similar to the embodiment of FIG. 1 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the substrate 252 surface. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 200 by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the gas cluster ion beam with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 200. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Control system 190 comprises a microprocessor, memory, and a digital I/O port capable of generating control voltages sufficient to communicate and activate inputs to GCIB processing system 100 (or 200) a as well as monitor outputs from GCIB processing system 100 (or 200). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 200), or it can be remotely located relative to the GCIB processing system 100 (or 200). For example, control system 190 can exchange data with GCIB processing system 100 using a direct connection, an intranet, and/or the Internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the Internet. Furthermore, another computer (i.e., controller, server, etc.) can access control system 190 to exchange data via a direct connection, an intranet, and/or the Internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 3:
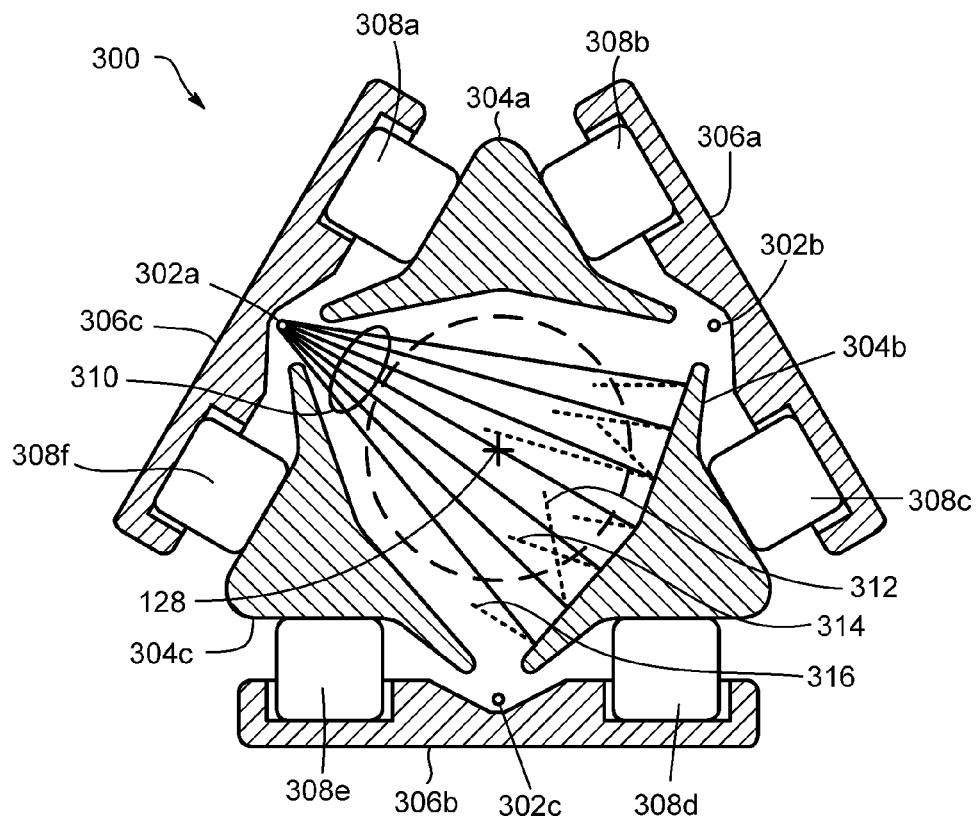
FIG. 3 is an illustration of an ionization source for a GCIB processing system.

Referring now to FIG. 3, a section 300 of a gas cluster ionizer (122, FIGS. 1 and 2) for ionizing a gas cluster jet (gas cluster beam 118, FIGS. 1 and 2) is shown. The section 300 is normal to the axis of GCIB 128. For typical gas cluster sizes (2000 to 15000 atoms), clusters leaving the skimmer aperture (120, FIGS. 1 and 2) and entering an ionizer (122, FIGS. 1 and 2) will travel with a kinetic energy of about 130 to 1000 electron volts (eV). At these low energies, any departure from space charge neutrality within the ionizer 122 will result in a rapid dispersion of the jet with a significant loss of beam current. FIG. 3 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Alternatively, ionizers may use electron extraction from plasma to ionize clusters. The geometry of these ionizers is quite different from the three filament ionizer described here but the principles of operation and the ionizer control are very similar.

According to an embodiment, GCIB processing is utilized to process substrates used in semiconductor manufacturing. In particular, a GCIB composition may be selected that forms a thin H-DLC film on a surface of a substrate. According to some embodiments, a GCIB composition may contain a hydrocarbon gas, for example methane ($CH_4$) or ethane ($C_2H_6$), and He gas. For example, the GCIB can be provided using either of the GCIB processing systems (100 or 200, or combinations thereof) depicted in FIGS. 1 and 2.

Figure 4:
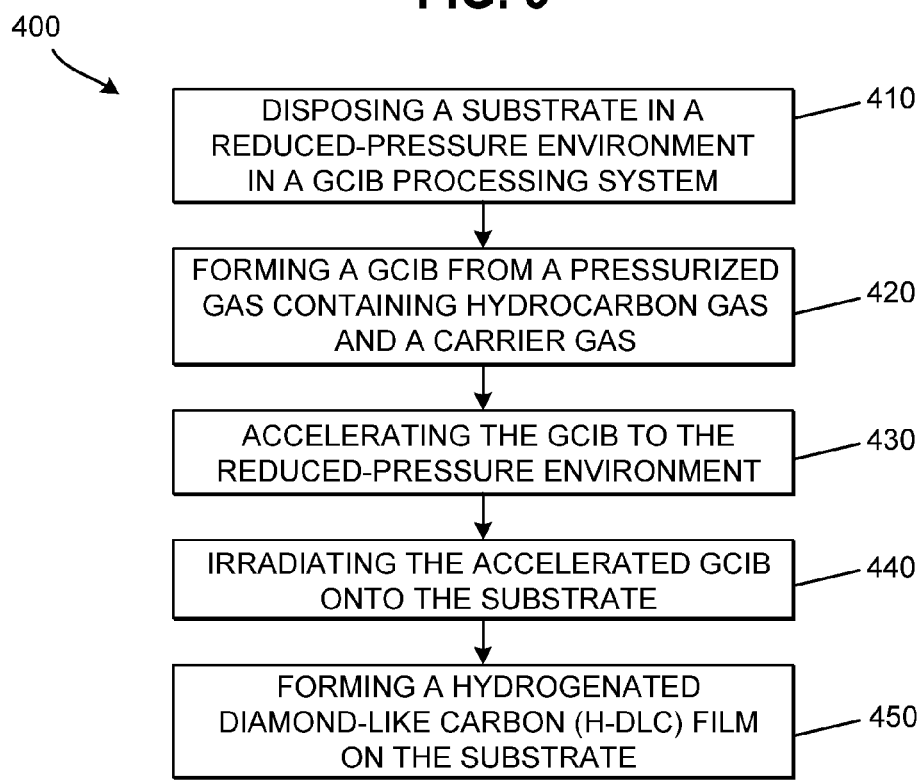
FIG. 4 illustrates a method of depositing an H-DLC film on a substrate according to an embodiment of the invention.

Referring to FIG. 4, a method of depositing an H-DLC film on a substrate using a GCIB is illustrated according to an embodiment of the invention. The method includes a flow-chart 400 beginning in 410 with disposing a substrate in a reduced-pressure environment in a GCIB processing system. The substrate can be positioned on a substrate holder and may be securely held by the substrate holder. The temperature of the substrate may or may not be controlled. For example, the substrate may be heated or cooled during an H-DLC film forming process. In one example, the substrate may be maintained at approximately room temperature, e.g., between approximately 20° C. and approximately 30° C. In other examples the substrate temperature may be maintained between approximately 20° C. and approximately 100° C., or between approximately 20° C. and approximately 50° C. The substrate temperature may be raised above approximately room temperature by exposing the substrate to a GCIB and/or by a heating system coupled to the substrate holder. The substrate can include a conductive material, a non-conductive material, or a semi-conductive material, or a combination of two or more materials thereof. Additionally, the substrate may include one or more material structures formed thereon, or the substrate may be a blanket substrate free of material structures.

In 420, a GCIB is formed from a pressurized gas containing a hydrocarbon gas and a carrier gas. As described above, the pressurized gas is expanded into a reduced pressure environment to form gas-clusters, the gas-clusters are ionized, and optionally filtered. According to embodiments of the invention, the hydrocarbon gas can have a general formula $C_xH_y$, where x has a range of between 1 and 4 and y has a range of between 2 and 10. Examples of $C_xH_y$ hydrocarbon gases include methane ($CH_4$), acetylene ($C_2H_2$), ethane ($C_2H_6$), propylene ($C_3H_6$), propyne ($C_3H_4$), propane ($C_3H_8$), butane ($C_4H_{10}$), butylene ($C_4H_8$), or butadiene ($C_4H_6$), as well as combinations thereof. According to one embodiment of the invention, the hydrocarbon gas is $CH_4$ gas. According to another embodiment of the invention, the hydrocarbon gas is $C_2H_6$ gas. However, other hydrocarbon gases may be used.

The different $C_xH_y$ hydrocarbon gases have different relative hydrogen content as indicated by the hydrogen to carbon y/x ratios. For example, $CH_4$ has a y/x ratio of 4 while $C_2H_6$ has a y/x ratio of 3 and $C_2H_2$ has a y/x ratio of 1. The different relative hydrogen content of the $C_xH_y$ hydrocarbon gases may be used to select and control the hydrogen content of H-DLC films to be deposited on a substrate. Thus, a GCIB containing $CH_4$ gas is expected to yield an H-DLC film with higher hydrogen content than a GCIB containing $C_2H_6$ gas, and a GCIB containing $C_2H_6$ gas is expected to yield an H-DLC film with higher hydrogen content than a GCIB containing $C_2H_2$ gas. According to some embodiments, hydrogen content of H-DLC films may be further controlled using a carrier gas containing or consisting of $H_2$ gas and/or $NH_3$ gas.

The pressurized gas can contain between 5 and 95% hydrocarbon gas, for example at least 5, 10, 20, 30, 40, 50, 60, 70, 80, 90, or 95% hydrocarbon gas. Similarly, the pressurized gas can contain between 5 and 95% carrier gas, for example at least 5, 10, 20, 30, 40, 50, 60, 70, 80, 90, or 95% carrier gas. According to one embodiment, the carrier gas can contain He gas, $H_2$ gas, or $NH_3$ gas, or a combination thereof. In some embodiments, the pressurized gas can consist of a hydrocarbon gas and a He gas. In some examples, the pressurized gas can consist of at least 5, 10, 20, 30, 40, 50, 60, 70, 80, 90, or 95% hydrocarbon gas, and balance He gas. The concentration of the carrier gas in the pressurized gas can be used to control the density and deposition rate of the H-DLC films.

According to other embodiments, the pressurized gas may further contain Ar gas, $N_2$ gas, or $O_2$ gas, or a combination of two or more thereof. The addition of one or more of these gases can be utilized to effect the composition of the H-DLC films. The addition of $NH_3$ gas and $H_2$ gas to the pressurized gas can be used to control the hydrogen percentage in the H-DLC films.

In 430, the GCIB is accelerated to the reduced-pressure environment containing the substrate to be processed. According to embodiments of the invention, the GCIB is accelerated utilizing an acceleration voltage that results in breaking of molecular bonds in the hydrocarbon gas impinging on the substrates and results in deposition of H-DLC films on the substrate. Some embodiments of the invention may utilize a GCIB acceleration voltage greater than 30, 35, 40, 45, 50, 55, or even greater than 60 keV. According to some embodiments of the invention, the GCIB may be accelerated by an acceleration voltage between approximately 45 keV and approximately 55 keV, for example approximately 50 keV.

In 440, the substrate is irradiated with the accelerated GCIB. The accelerated GCIB may be scanned onto at least a portion of the entire surface of the substrate. Additionally, the GCIB dose may be adjusted as a function of position on the surface of the substrate in order to vary the H-DLC film deposition over the entire surface of the substrate. As described above, the combination of X-scanning and Y-scanning motions translates the substrate, held by a substrate holder, in a raster-like scanning motion through GCIB to cause a uniform (or otherwise programmed) irradiation of a surface of the substrate by the GCIB.

In 450, an H-DLC film is formed on the substrate by the exposure of the GCIB. According to some embodiments of the invention, the H-DLC film may have a hydrogen content greater than approximately 30, 40, 50, or even greater than approximately 60 atomic percent. In one example, the hydrogen content may be between approximately 40 atomic % and approximately 50 atomic %. According to other embodiments, the H-DLC film may have a hydrogen content greater than approximately 10 atomic % and less than approximately 30 atomic %.

As described above, deposited H-DLC films contain a diamond carbon phase having $sp^3$ bonds and a carbon phase having non-$sp^3$ bonds. According to one embodiment of the invention, the H-DLC films deposited by GCIB may have between approximately 20 and 85% $sp^3$ bonds and hydrogen content between approximately 10 atomic % and approximately 50 atomic %. According to one embodiment, the percentage of the $sp^3$ bonds in the H-DLC film can be greater than approximately 60%. According to another embodiment, the H-DLC film can have a hydrogen content less than approximately 30 atomic %.

Figure 5A:
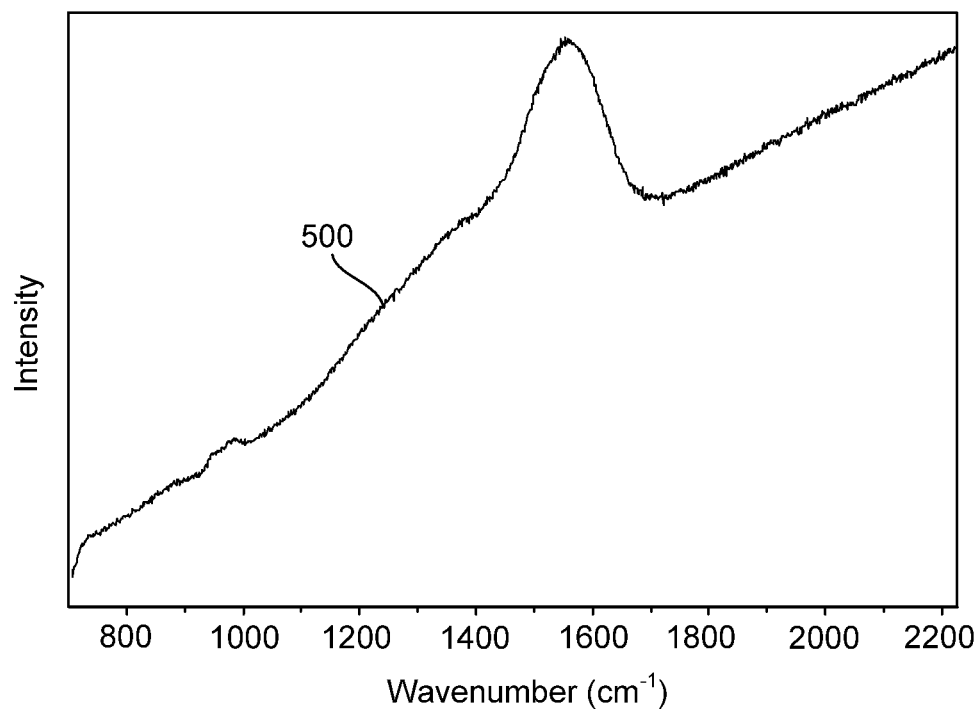
FIGS. 5A and 5B show Raman spectra of a first H-DLC film deposited on a Si substrate using GCIB processing according to an embodiment of the invention.
Figure 5B:
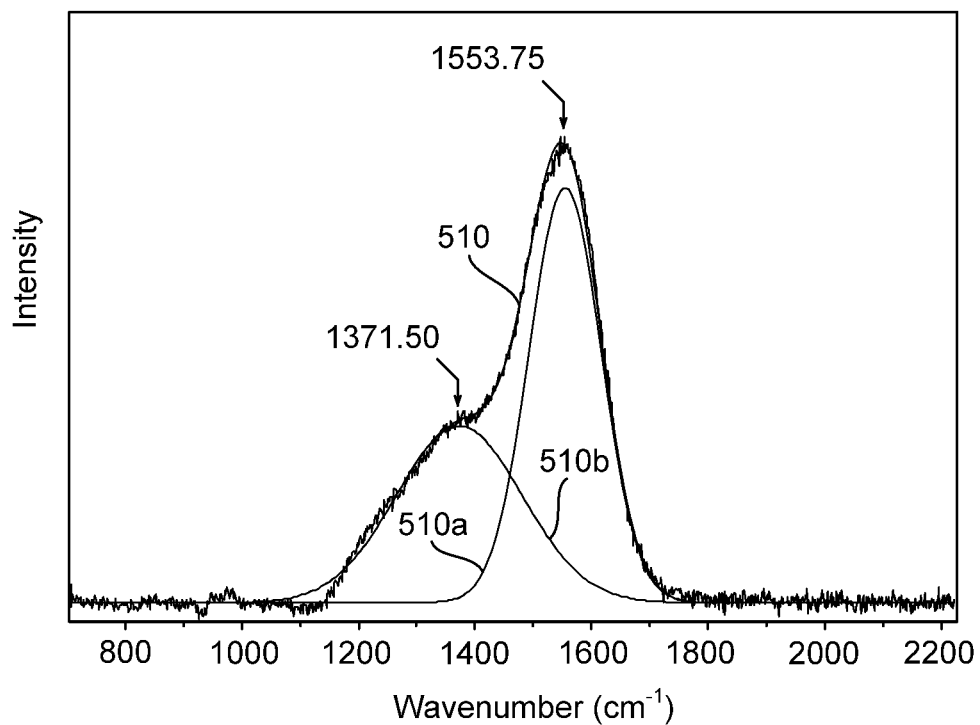

FIGS. 5A and 5B show Raman spectra of a first H-DLC film deposited on a Si substrate using GCIB processing according to an embodiment of the invention. The first H-DLC film had a thickness of approximately 25 nm and was deposited using a pressurized gas consisting of 10% $CH_4$ gas and 90% He gas. The flow rate of the pressurized gas was 2300 sccm. The processing conditions further included a GCIB exposure time of 10 min, a GCIB acceleration voltage of 50 kV, and a substrate temperature of approximately room temperature. FIG. 5A shows an uncorrected (raw) Raman spectra 500 of the first H-DLC film deposited on the Si substrate. The uncorrected Raman spectra 500 has a steep background due to high hydrogenation of the first H-DLC film.

FIG. 5B shows a baseline corrected Raman spectra 510 of the first H-DLC film 500 in FIG. 5A. The baseline corrected Raman spectra 510 was band-fitted with Gaussian-Lorentzian bands for the D(~1360 $cm^{-1}$) band 510b and the G(~1550 $cm^{-1}$) band 510a of elemental carbon in order to estimate the H-DLC quality and $sp^3$ content of the first H-DLC film. The peak height ratio of the D and G bands ($H_D/H_G$) was used to estimate a $sp^3$ content of 65% of the first H-DLC film.

Figure 6A:
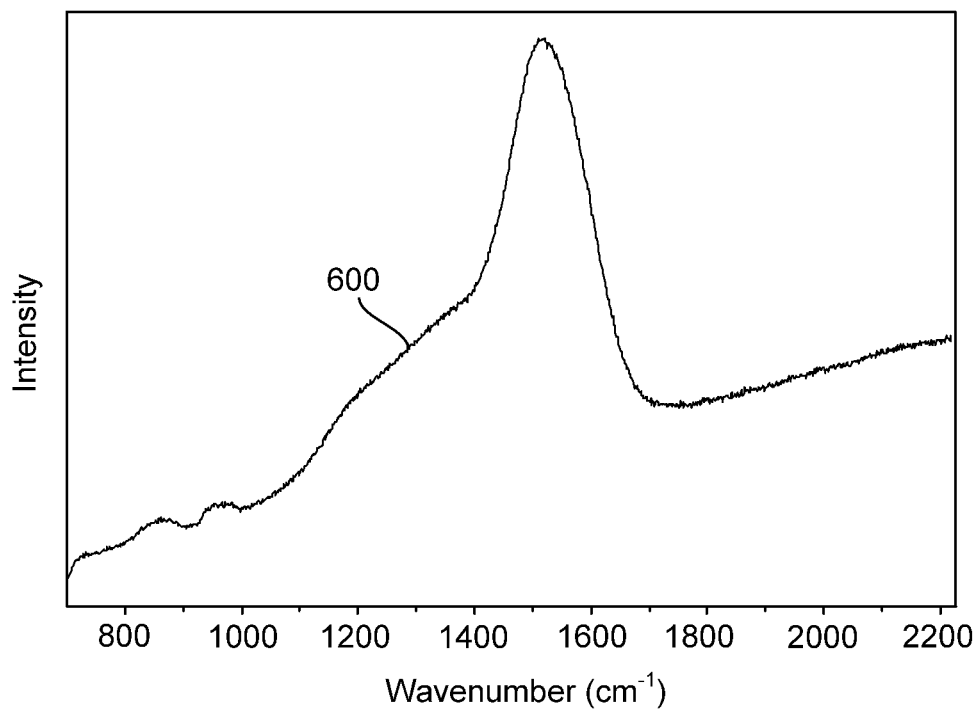
FIGS. 6A and 6B show Raman spectra of a second H-DLC film deposited on a Si substrate using GCIB processing according to an embodiment of the invention.
Figure 6B:
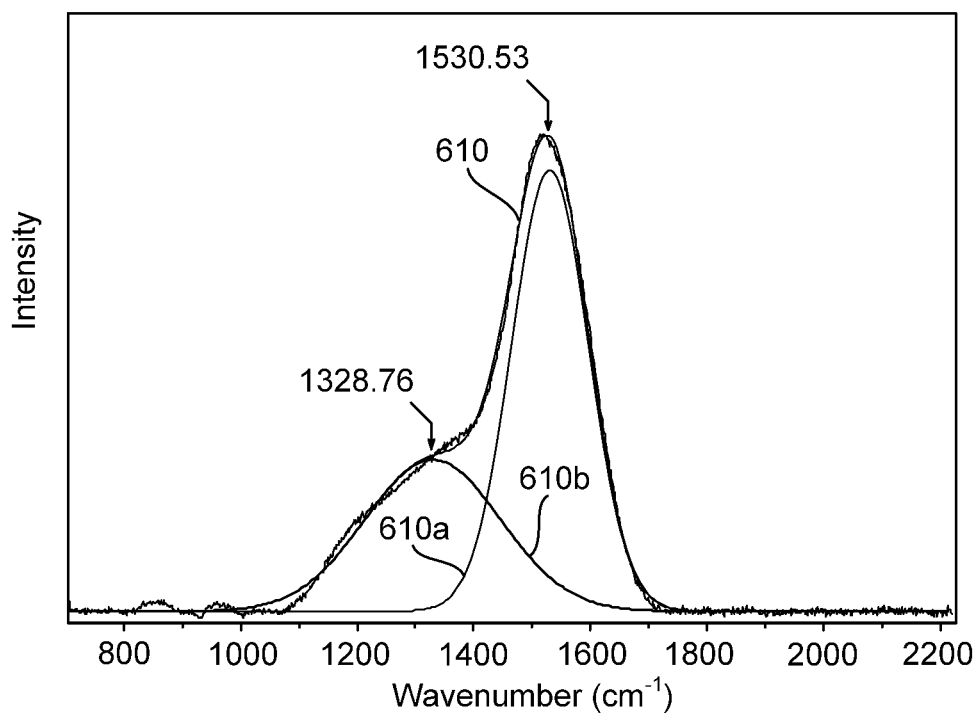

FIG. 6A and 6B show Raman spectra of a second H-DLC film deposited on a Si substrate using GCIB processing according to an embodiment of the invention. The second H-DLC film had a thickness of approximately 90 nm and was deposited using a pressurized gas consisting of 10% $CH_4$ gas and 90% He gas. The flow rate of the pressurized gas was 2300 sccm. The processing conditions further included a GCIB exposure time of 10 min, a GCIB acceleration voltage of 50 kV, substrate temperature of approximately room temperature, and the GCIB was passed through a pressure cell containing argon (Ar) gas. FIG. 6A shows an uncorrected Raman spectra 600 of the second H-DLC film deposited on the Si substrate.

FIG. 6B shows a baseline corrected Raman spectra 610 of the second H-DLC film in FIG. 6A. Using the peak height ratio $H_D/H_G$ of the D band 610b and the G band 610a, the second H-DLC film in FIG. 6B had an estimated $sp^3$ content of 69% and contained 43 atomic % H and 57 atomic percent C. The composition of the second H-DLC film was estimated using hydrogen forward scattering (HFS).

A plurality of embodiments for depositing H-DLC films onto substrates using GCIB has been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for depositing a thin film on a surface of a substrate, comprising:
    maintaining a reduced-pressure environment around a substrate holder for holding a substrate having a surface;
    holding the substrate securely within the reduced-pressure environment;
    forming a gas cluster ion beam (GCIB) from a pressurized gas comprising a hydrocarbon gas and a carrier gas;
    accelerating the GCIB to the reduced-pressure environment;
    irradiating the accelerated GCIB onto at least a portion of the surface; and
    forming a hydrogenated diamond-like carbon (H-DLC) film on the surface.

2. The method of claim 1, wherein the carrier gas comprises helium (He) gas, hydrogen ($H_2$) gas, or ammonia ($NH_3$) gas, or a combination thereof.

3. The method of claim 1, wherein the hydrocarbon gas has a general formula $C_xH_y$, where x has a range of between 1 and 4 and y has a range of between 2 and 10.

4. The method of claim 1, wherein the hydrocarbon gas is methane ($CH_4$).

5. The method of claim 1, wherein the pressurized gas comprises methane ($CH_4$) gas or ethane ($C_2H_6$) gas, and He gas.

6. The method of claim 1, wherein the pressurized gas consists of methane ($CH_4$) gas or ethane ($C_2H_6$) gas, and He gas.

7. The method of claim 2, wherein the pressurized gas further comprises argon (Ar) gas, nitrogen ($N_2$) gas, or oxygen ($O_2$) gas, or a combination of two or more thereof.

8. The method of claim 1, wherein the accelerating comprises accelerating the GCIB by an acceleration voltage greater than 30 keV.

9. The method of claim 1, wherein the accelerating comprises accelerating the GCIB by an acceleration voltage of approximately 50 keV.

10. The method of claim 1, wherein the H-DLC film comprises a diamond carbon phase having $sp^3$ bonds and a carbon phase having non-$sp^3$ bonds.

11. The method of claim 10, wherein the percentage of the $sp^3$ bonds in the H-DLC film is greater than approximately 60%.

12. The method of claim 10, wherein the percentage of the $sp^3$ bonds in the H-DLC film is between approximately 20% and approximately 85%, and wherein the H-DLC film has a hydrogen content between approximately 10 atomic % and approximately 50 atomic %.

13. The method of claim 1, wherein the H-DLC film has a hydrogen content greater than approximately 10 atomic % and less than approximately 30 atomic %.

14. The method of claim 1, wherein the holding further comprises maintaining the substrate at approximately room temperature.

15. A method for depositing a thin film on a surface of a substrate, comprising:
    maintaining a reduced-pressure environment around a substrate holder for holding a substrate having a surface;

holding the substrate securely within the reduced-pressure environment;

forming a gas cluster ion beam (GCIB) from a pressurized gas comprising a hydrocarbon gas and a carrier gas selected from helium (He) gas, hydrogen ($H_2$) gas, or ammonia ($NH_3$) gas, or a combination thereof;

accelerating the GCIB by an acceleration voltage greater than 30 keV to the reduced-pressure environment; and irradiating the accelerated GCIB onto at least a portion of the surface to form a hydrogenated diamond-like carbon (H-DLC) film on the surface.

16. The method of claim 15, wherein the accelerating comprises accelerating the GCIB by an acceleration voltage of approximately 45 keV to approximately 55 keV.

17. The method of claim 15, wherein the H-DLC film comprises a diamond carbon phase having $sp^3$ bonds and a carbon phase having non-$sp^3$ bonds, wherein the percentage of the $sp^3$ bonds in the H-DLC film is greater than approximately 60%.

18. The method of claim 15, wherein the H-DLC film has a hydrogen content greater than approximately 10 atomic % and less than approximately 30 atomic %.

19. A method for depositing a thin film on a surface of a substrate, comprising:

maintaining a reduced-pressure environment around a substrate holder for holding a substrate having a surface, the substrate being maintained at approximately room temperature;

holding the substrate securely and at approximately room temperature within the reduced-pressure environment;

forming a gas cluster ion beam (GCIB) from a pressurized gas consisting of methane ($CH_4$) gas and helium gas;

accelerating the GCIB by an acceleration voltage greater than 30 keV to the reduced-pressure environment; and irradiating the accelerated GCIB onto at least a portion of the surface to form a hydrogenated diamond-like carbon (H-DLC) film on the surface.

20. The method of claim 19, wherein the H-DLC film comprises a diamond carbon phase having $sp^3$ bonds and a carbon phase having non-$sp^3$ bonds, the percentage of the $sp^3$ bonds in the H-DLC film is greater than approximately 60%, and the H-DLC film has a hydrogen content greater than approximately 10 atomic % and less than approximately 30 atomic %.

* * * * *